United States Patent

Van Buul et al.

[11] Patent Number: 5,554,944
[45] Date of Patent: Sep. 10, 1996

[54] SAMPLING CIRCUIT

[75] Inventors: Marinus C. W. Van Buul; Petrus G. M. Centen, both of Breda, Netherlands

[73] Assignee: U.S. Philips Corporation, New York, N.Y.

[21] Appl. No.: 496,279

[22] Filed: Jun. 28, 1995

[30] Foreign Application Priority Data

Jul. 4, 1994 [EP] European Pat. Off. ............. 94201914

[51] Int. Cl.$^6$ ............................................ G11C 27/02
[52] U.S. Cl. ..................... 327/91; 327/383; 327/551
[58] Field of Search ........................ 327/91, 94, 131, 327/133, 311, 313, 314, 317, 381, 383, 384, 551

[56] References Cited

U.S. PATENT DOCUMENTS

| | | | |
|---|---|---|---|
| 2,815,426 | 12/1957 | Rothstein | 327/381 |
| 2,852,622 | 9/1958 | Fedde et al. | 327/551 |
| 2,880,316 | 3/1959 | Wozencraft | 327/94 |
| 2,964,687 | 3/1959 | Eakin | 327/383 |
| 3,411,096 | 11/1968 | Rainger et al. | 327/91 |
| 3,568,085 | 3/1971 | Pimenoff | 327/95 |
| 3,628,161 | 12/1971 | Earp | 327/94 |
| 4,904,962 | 2/1990 | Greene | 331/117 R |
| 4,939,472 | 7/1990 | Uchida et al. | 327/91 |
| 4,990,906 | 2/1991 | Kell et al. | 340/825.31 |
| 5,027,120 | 6/1991 | Thurston | 341/143 |
| 5,317,183 | 5/1994 | Hoffman et al. | 327/551 |

FOREIGN PATENT DOCUMENTS

| | | | |
|---|---|---|---|
| 437885 | 7/1991 | European Pat. Off. | 327/551 |
| 363277426 | 1/1988 | Japan | 327/551 |
| 3203899 | 9/1991 | Japan | G11C 27/02 |

OTHER PUBLICATIONS

"Charge–Coupled Device Signal Processing Models and Comparisons" by Thomas W. McCurnin et al, Journal of Electronic Imaging 2(2), pp. 100–107, Apr. 1993.

"An Improved Correlated Double Sampling Circuit For Low–Noise Charge–Coupled Devices, IEEE Transactions on Circuits on Circuits and systems, vol.", No. 12, Dec. 1990, pp. 1559–1565.

*Primary Examiner*—Timothy P. Callahan
*Assistant Examiner*—My-Trang Nu Ton
*Attorney, Agent, or Firm*—Edward W. Goodman

[57] ABSTRACT

In a sampling circuit including a first main terminal (P) and a series coupling of a hold capacitor (C2) and a sampling switch (S2) between the first main terminal (P) and a second main terminal (E), a parallel circuit (L2, R4) of a coil and a resistor (L2) is coupled in series with the sampling switch (S2) and the hold capacitor (C2), whereby the combination of the coil (L2), the resistor (R4) and the hold capacitor (C2) generate an excitation within a time period in which the sampling switch (S2) is conductive.

5 Claims, 2 Drawing Sheets

5,554,944

SAMPLING CIRCUIT

BACKGROUND OF THE INVENTION

1. Field of the Invention

The invention relates to a sampling circuit comprising a first main terminal and a series coupling of a hold capacitor and a sampling switch between said first main terminal and a second main terminal.

2. Description of the Related Art

The article "An improved correlated double sampling circuit for low-noise charge-coupled devices", IEEE transactions on circuits and systems, vol. 37, no. 12, december 1990, pp. 1559–1565 describes a prior an correlated double sampling circuit for low noise charge-coupled devices. The noise suppression of the circuit shown in FIG. 2 of the article is, however, not deemed to be good enough. The same holds for the improved circuit shown in FIG. 4 of the article, as in both circuits, the RC time constant of the low-pass filter preceding the proper correlated double sampling circuit cannot be large enough to obtain a good noise suppression, as a large RC time constant results in the disadvantage that the capacitors of the proper correlated double sampling circuit cannot be charged to their respective end values within the time slot between two sampling instants. If the time-constant of the low-pass filter preceding the correlated double sampling circuit, or any of the RC time constants of the proper correlated double sampling circuit, is large enough to obtain a satisfactory noise suppression, an undesired crosstalk between successive samples occurs.

The dual slope integration technique described in the overview article "Charge-coupled device signal processing models and comparisons", Journal of Electronic Imaging 2(2), 100–107 (April 1993), has a very good noise performance, but a circuit operating in accordance with the dual slope integration technique at sampling frequencies above 1 MHz, and certainly above 10 MHz, is difficult to manufacture. Consequently, dual slope integration cannot be applied to broadcast television cameras in which sampling rates of e.g., 36 MHz are used.

SUMMARY OF THE INVENTION

It is, inter alia, an object of the invention to provide a sampling circuit with improved noise reduction capabilities and capable of operating at sampling frequencies above 10 MHz. To this end, a first aspect of the invention provides a sampling circuit as comprising a first main terminal and a series coupling of a hold capacitor and a sampling switch between said first main terminal and a second main terminal, characterized in that a parallel circuit of a coil and a resistor is coupled in series with said sampling switch and said hold capacitor, whereby the combination of the coil, the resistor and the hold capacitor is adapted to generate an excitation within a time period in which the sampling switch is conductive. A second aspect of the invention, provides a CCD output decoding circuit including such a sampling circuit.

In accordance with the invention, in a sampling circuit comprising a first terminal and a series coupling of a hold capacitor and a sampling switch between the first terminal and a second main terminal, a parallel circuit of a coil and a resistor is coupled in series with the sampling switch and the hold capacitor, whereby the combination of the coil, the resistor and the hold capacitor is adapted to generate an excitation within a time period in which the sampling switch is conductive. The addition of the parallel circuit of the coil and the resistor yields the advantage that this LR parallel circuit effects an excitation in the LCR circuit which ensures that a voltage across the hold capacitor reaches its end value in due time at the instant of the opening of the sampling switch, so that no undesired cross-talk between successive samples occurs, while the RC time constant can be large enough to effect a sufficient noise suppression.

It has to be noted that JP-A-3/203,899 discloses a high-speed sampling circuit in which a coil is connected between the output terminal of a diode bridge and the common connecting point of a capacitor and a resistor, to increase an upper limit frequency and to improve a sampling sensitivity. The coil and the capacitor are so selected that they resonate at about the upper limit of the necessary frequency band. Nothing in this document suggests that the insertion of a coil is capable of contributing to an improvement of the noise behavior of a sampling circuit. It is noted that in the application of the invention in, for example, CCD output circuits, sample frequencies are not that high that a skilled person needs to search for techniques which render a further increase of the sampling frequency feasible.

These and other aspects of the invention will be apparent from and elucidated with reference to the embodiments described hereinafter.

BRIEF DESCRIPTION OF THE DRAWINGS

In the drawings:

FIG. 1 shows a prior art correlated double sampling circuit largely corresponding to that shown in FIG. 2a of the article IEEE transactions on circuits and systems, vol. 37, no. 12, december 1990, pp. 1559–1565, incorporated herein by reference. An input signal I at the input E' (second main terminal E') is applied thru a capacitor C1 to an input of a buffer amplifier B1. The input of the buffer amplifier B1 is connected to ground (first main terminal P') thru a series connection of a resistor R1 and a switch S1. The resistor R1 corresponds to the resistance of the switch S1; an additional series resistance may be included. An output of the buffer amplifier B1 (first main terminal P) is connected to an input of a buffer amplifier B2 thru a series connection of a sampling switch S2 and a resistor R2. The resistor R2 corresponds to the resistance of the sampling switch S2; an additional series resistance may be included. The input of the buffer amplifier B2 is connected to ground (second main terminal E) thru a hold capacitor C2. An output of the buffer amplifier B2 supplies an output signal O.

FIG. 2 schematically shows an output signal I of a charge-coupled device (CCD) image sensor (not shown), which output signal includes noise. The CCD output signal of FIG. 2 is input to the circuit shown in FIG. 1. During reset periods TR0, TR1, TR2, TR3, TR4, . . . of the CCD output signal, the switch S1 is closed and the capacitor C1 is charged to the reset level of the input signal thru the switch S1 and the resistor R1. The input signal reset level includes broadband thermic noise, low-frequent 1/f noise, and a reset noise component which varies stepwise from sample to sample and which is added to the reset level at an output stage internally in the CCD sensor. At the end of the reset periods TR0, TR1, TR2, TR3, TR4, . . . , the switch S1 is opened, and during the signal periods TS0, TS1, TS2, TS3, TS4, . . . of the input signal I, the sampling switch S2 is closed. At the first main terminal P of the circuit, a voltage is available which amounts to the input voltage I minus the voltage over the capacitor C1 (the hold reset level). Hold capacitor C2 is now charged thru the resistor R2 to the voltage at the first main terminal P. Thereafter, sampling switch S2 is opened. At the next reset period, the switch S1 is closed again, etc. It will thus be understood that the elements at the left-hand side of the first main terminal P form a clamp circuit, i.e. a circuit which samples and holds the reset levels VR0, VR1, VR2, VR3, VR4, . . . , while the elements at the right-hand side of the first main terminal P form the proper sample and hold circuit furnishing the signal levels VS0, VS1, VS2, VS3, . . . . From FIG. 1, it will also be clear that the clamp circuit is basically the same circuit as the sampling circuit, with reference potential (P', E) and signal input terminals (E', P) interchanged.

FIG. 3 shows an embodiment of a sampling circuit in accordance with the present invention. Coils L1 and L2 (with parallel resistances R3 and R4, respectively) are inserted in series with the switches S1 and S2, respectively. This effects an excitation in the LCR circuits during the periods in which the respective switches S1 and S2 are conducting, so that the respective end values of the signals at the respective capacitors C1 and C2 can be reached in due time even with large time constants (RC, L/R) which are required for a good noise performance, without an undesired crosstalk occurring. Calculations have shown that an optimal noise performance is obtained when the respective voltages at the capacitors C1, C2 equal their desired end values, that the performance of the circuit is little sensitive to any component value tolerances, and that the noise performance of the circuit approximates that of the dual slope integrator up to 0.4 dB.

For an optimal signal-noise behavior, the following rules apply:

$$L/Rp = 0.137 * dT$$

$$C * Rs = 0.368 * dT$$

$$C * Rp = 0.927 * dT,$$

in which:
  dT is the time period in which the end value has to be reached. In most cases, dT is the time in which the corresponding switch (e.g. a FET) is conducting. In contrast herewith, in JP-A-3/203,899, the relevant time period is the sample period, as the prior art addition of the coil serves to create an oscillation at the sample frequency while in the circuit of the present invention, the time period dT in which the end value has to reached, which is a fraction (the duty cycle) of the sample period, is the only relevant reference. As an example of an optimal implementation, the component values mentioned below are applied at a dT of 24 ns.
  L is the coil (L1 or L2). Preferably, L=1.2 μH.
  Rp is the resistor connected in parallel to the coil (R3 or R4). Preferably, Rp=330 Ω.
  C=56 pF.
  Rs is the sum of the on-resistance of the switch and an added series resistance (R1 or R2). It is recommended to add a relatively large series resistance to reduce the influence of any deviations in the on-resistance of the switch. For example, the FET has a typical on-resistance of 36 Ω (between 25 and 50) and the series resistance has a preferred value of 100 Ω.

It appears that in the circuit according to the present invention, the product C*Rp can be chosen to be about the time that the sampling switch is conductive. Without the added coil, about three to five RC time constants are required to reach the end value, or put otherwise, the RC time constant can only be about one fourth of the time period in which the end value has to be reached. With such a small RC time period, no satisfactory noise suppression is possible. With the added coil in accordance with the present invention, the RC time constant can be much larger, large enough for a satisfactory noise suppression, while thanks to the added coil, the end value is still reached in due time.

Figure 4:
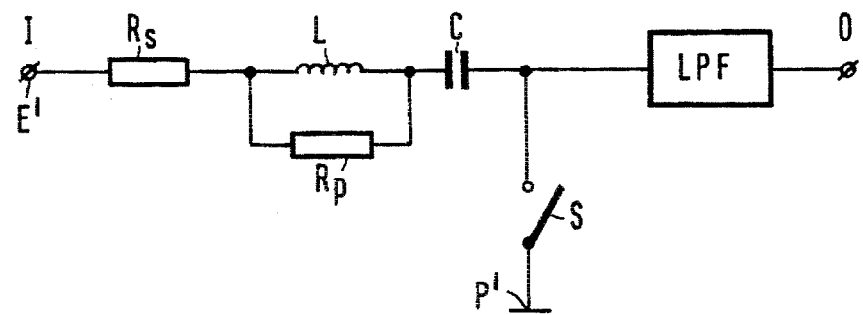
FIG. 4 shows another sampling circuit especially suitable for use with CCD cameras.

The sampling circuit embodiment of FIG. 4 is especially suitable for low-end CCD cameras, in which only a clamp circuit (i.e., a reset level sampling circuit) and a low-pass filter are used. The input signal I is applied to a clamp circuit comprising a series connection of a series resistor Rs, a coil-resistor parallel circuit having a coil L and a parallel resistor Rp, and a capacitor C having a first terminal connected to the coil-resistor parallel circuit L, Rp and a second terminal connected to ground (P') through a switch S. For an optimum noise reduction, the coil, the parallel resistor and the capacitor should be positioned in the signal path E'-O, whereby the order of the elements is less relevant. The second terminal of the capacitor C forms the output of the clamp circuit and is connected through a low-pass filter LPF to the output O of the sampling circuit of FIG. 4.

Figure 1:
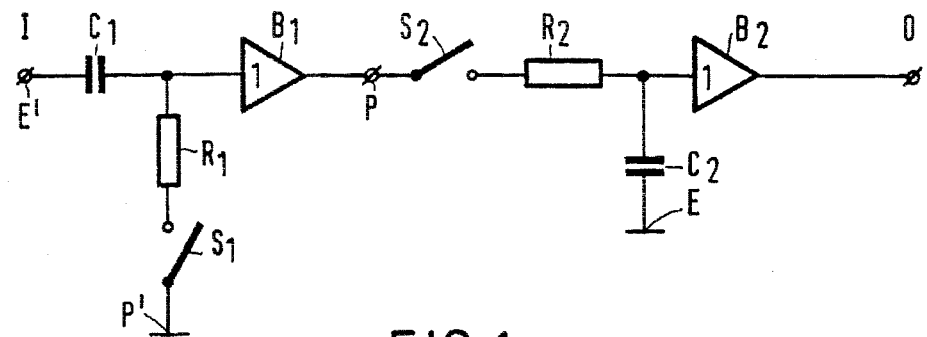
FIG. 1 shows a correlated double sampling circuit without the coil added in accordance with the present invention.
Figure 2:
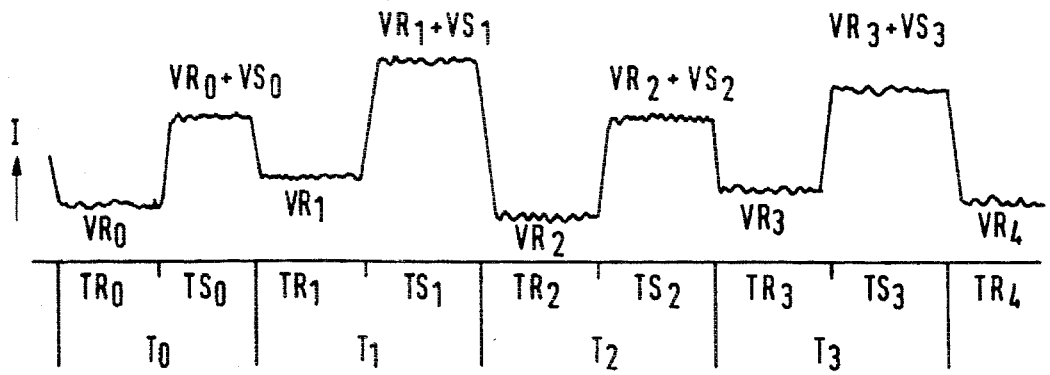
FIG. 2 shows an CCD-generated input signal of the circuit of FIG. 1.
Figure 3:
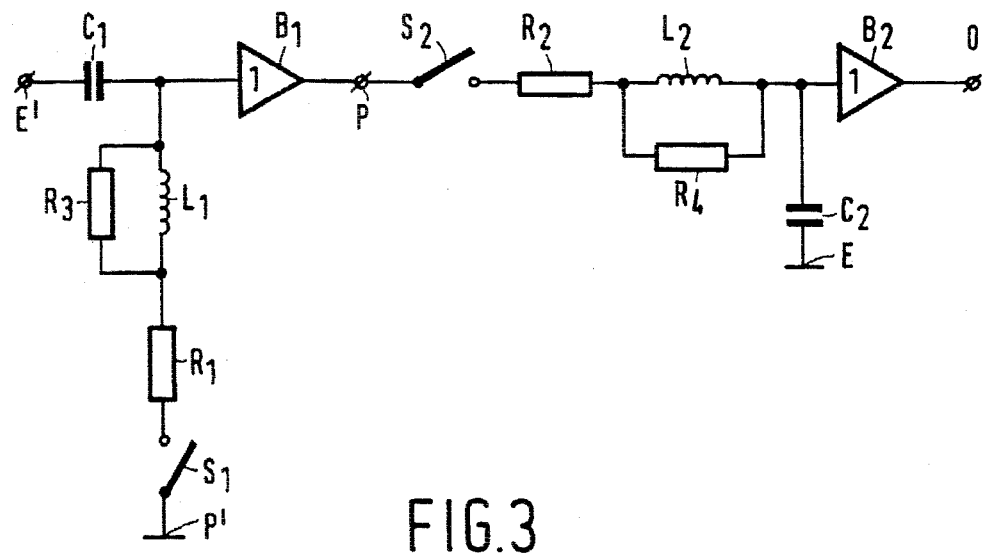
FIG. 3 shows an embodiment of a sampling circuit in accordance with the present invention.
Figure 5:
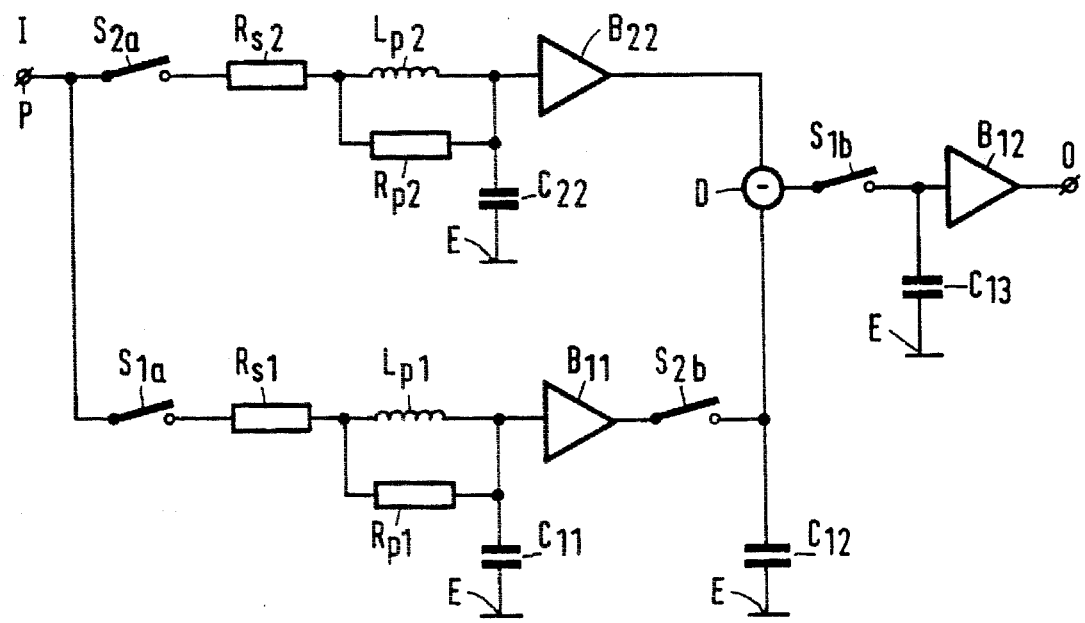
FIG. 5 shows a still further sampling circuit.

The sampling circuit embodiment of FIG. 5 avoids the use of capacitors of which both terminals are not connected to ground, like the capacitor C1 in FIG. 3 and the capacitor C in FIG. 4, as such capacitors cannot easily be incorporated in an integrated circuit. In the embodiment of FIG. 5, the switches S1 and S2 have the same timing (control) as in FIG. 3. The input signal I is applied to a first series connection of a sampling switch S2a, a series resistance Rs2, a parallel connection of a coil Lp2 and a resistor Rp2, and a hold capacitor C22 having a first terminal connected to ground and a second terminal connected to the coil-resistor parallel connection Lp2, Rp2 and to an input of a buffer B22. The input signal I is further applied to a second series connection of a sampling switch S1a, a series resistance Rs1, a parallel connection of a coil Lp1 and a resistor Rp1, and a hold capacitor C11 having a first terminal connected to ground and a second terminal connected to the coil-resistor parallel connection Lp1, Rp1 and to an input of a buffer B11. An output of the buffer B11 is connected to a first terminal of a hold capacitor C12 thru a sampling switch S2b. A second terminal of the hold capacitor C12 is connected to ground. The voltage at the first terminal of the hold capacitor C12 is subtracted from the output voltage of the buffer B22 by a subtracter D. An output of the subtracter D is connected to a first terminal of a hold capacitor C13 thru a sampling switch S1b. A second terminal of the hold capacitor C13 is connected to ground. The first terminal of the hold capacitor C13 is connected to the circuit output O thru a buffer B12. It will be clear that by a straightforward permutation of the circuit elements, the coils Lp1 and Lp2 can be shifted to the input and thus be placed outside an integrated circuit comprising the remainder of the circuit elements.

It should be noted that the above-mentioned embodiments illustrate rather than limit the invention, and that those skilled in the art will be able to design many alternative embodiments without departing from the scope of the appended claims. The invention may be used in various types of sample and hold circuits. For example, in FIG. 3, the part at the left-hand side of the first main terminal P can be omitted. The expression parallel circuit of a coil and a resistor includes the possibility of a further resistor in series with the coil, whereby the series connection of the coil and the further resistor forms one of the branches of the parallel circuit. In FIG. 3, the parallel circuit of the coil L2 and the resistor R4 may be placed between the first main terminal P and the sampling switch S2, whereby the expression coupled in series also includes this latter possibility. The series connections may include further resistors (or other elements) inserted at suitable positions.

The invention appeared to very advantageous (simple, small, not sensitive to component value variations, a very good performance) in combination with pre-amplifiers for CCD output signals.

We claim:

1. A sampling circuit comprising a first main terminal and a series coupling of a hold capacitor and a sampling switch between said first main terminal and a second main terminal, characterized in that a parallel circuit of a coil and a resistor is coupled in series with said sampling switch and a terminal of said hold capacitor, whereby the combination of the coil, the resistor and the hold capacitor oscillates within a time period in which the sampling switch is conductive.

2. A sampling circuit as claimed in claim 1, characterized in that the sampling circuit is a correlated double sampling circuit further comprising a first part between an input terminal and said first main terminal, said second main terminal being coupled to a reference potential, said first part including a first capacitor having a first terminal coupled to said input terminal and a second terminal coupled to said first main terminal, a first switch, and a first parallel circuit of a first coil and a first resistor, said first parallel circuit being coupled in series with the first switch between said second terminal of said first capacitor and a reference potential, whereby the combination of the first coil, the first resistor and the first capacitor oscillates within a time period in which the first switch is conductive.

3. A sampling circuit as claimed in claim 1, characterized in that a series resistor is coupled in series with said parallel circuit between said sampling switch and said terminal of said hold capacitor.

4. A sampling circuit as claimed in claim 1, characterized in that said sampling switch has a first terminal coupled to a reference potential, and a second terminal coupled to an output terminal thru a low-pass filter and to said hold capacitor.

5. A sampling circuit comprising:

a first branch including a series coupling of a first sampling switch, a first coil-resistor parallel circuit, a first hold capacitor having one terminal coupled to a reference potential and another terminal coupled to a first buffer, a further sampling switch having one terminal coupled to an output of the first buffer and an other terminal coupled to a reference potential thru a further hold capacitor;

a second branch coupled in parallel to said first branch and including a series coupling of a second sampling switch, a second coil-resistor parallel circuit, and a second hold capacitor having one terminal coupled to a reference potential and an other terminal coupled to a second buffer;

a subtracter having inputs connected to said other terminal of said further sampling switch and an output of said second buffer; and a third sampling switch having one terminal coupled to an output of the subtracter and an other terminal coupled to a reference potential thru a third hold capacitor, said other terminal being coupled to a circuit output.

* * * * *